United States Patent [19]

Honma et al.

[11] Patent Number: 5,546,348
[45] Date of Patent: Aug. 13, 1996

[54] SEMICONDUCTOR DISC STORAGE

[75] Inventors: Hisao Honma; Kazuo Nakagoshi, both of Odawara; Naoya Takahashi, Yokohama; Makoto Kogai; Kenichi Takamoto, both of Odawara, all of Japan

[73] Assignee: Hitachi, Ltd., Tokyo, Japan

[21] Appl. No.: 359,787

[22] Filed: Dec. 20, 1994

[30] Foreign Application Priority Data

Mar. 14, 1994 [JP] Japan .................................. 6-042581

[51] Int. Cl.⁶ .................................................. G11C 13/00
[52] U.S. Cl. .................. 365/230.03; 365/230.07
[58] Field of Search ..................... 365/189.01, 189.04, 365/189.05, 230.01, 230.03, 230.07, 230.08

[56] References Cited

U.S. PATENT DOCUMENTS 5,307,471 4/1994 Ishikawa ................................... 365/49

FOREIGN PATENT DOCUMENTS 2813698A 3/1990 Japan .

Primary Examiner—Terrell W. Pears
Attorney, Agent, or Firm—Kenyon & Kenyon

[57] ABSTRACT

A semiconductor storage device is connected to at least one magnetic storage device. The input and output of data is made between the semiconductor storage device and an information processing device. The semiconductor storage device includes an electrically erasable non-volatile semiconductor memory which stores directory information of data stored in the magnetic storage device, a volatile semiconductor memory which has a storage capacity smaller than that of the non-volatile semiconductor memory and the storage contents of which are updated to store a part of the directory information having a higher frequency of access from the information processing device, and a CPU connected to the volatile semiconductor memory and the non-volatile semiconductor memory for making access to the volatile semiconductor memory and the non-volatile semiconductor memory in accordance with an access request from the information processing device, wherein when access to the volatile semiconductor memory made for access from the information processing device to the magnetic storage device hits on the part of the directory information, the CPU transfers the part of the directory information to the information processing device without making access to the non-volatile semiconductor memory and the information processing device makes access to the magnetic storage device on the basis of the part of the directory information When a failure is generated in the non-volatile semiconductor memory or when a predicted service life of the non-volatile semiconductor memory is elapsed, the non-volatile semiconductor memory is substituted by an alternate memory.

15 Claims, 4 Drawing Sheets

SEMICONDUCTOR DISC STORAGE

BACKGROUND OF THE INVENTION

The present invention relates to a semiconductor storage device which can be used as a substitute for the conventional small-size magnetic disk device.

The conventional semiconductor disk storage disclosed by JP-A-2-81398 includes a non-volatile semiconductor memory which has a certain memory capacity and a volatile memory which has the same memory capacity as the non-volatile memory. In the disclosed semiconductor disk storage, a volatile memory having a high writing speed is generally used. At the time of the turn-off of a power supply, all data in the volatile memory are transferred to the non-volatile memory. Thereby, the preservation of data upon turn-off of the power supply and the improvement of an operating speed at the time of normal operation are implemented.

This prior art supposes a storage device for a large-size computer and gives the miniaturization no sufficient consideration. Namely, 3.5-inch, 2.5-inch and 1.8-inch hard disk devices are used in recent small-size work stations, personal computers or the like and semiconductor storage devices are also required to cope with such sizes.

The identity in capacity between the volatile memory and the non-volatile or flash memory in the above-mentioned prior art means the need of cache memories the number of which is substantially the same as that of the flash memories. Therefore, it is difficult to miniaturize a semiconductor disk device to a size on the same order as that of the small-size hard disk device.

SUMMARY OF THE INVENTION

The present invention combines or adds a small number of improved semiconductor storage devices to a storage system having a large number of large-capacity storage devices, thereby implementing the elongated lifetime of the storage system and the miniaturization thereof.

The present invention also provides a semiconductor disk system in which a non-volatile memory for backing up data of a volatile memory at the time of power-off is made larger in capacity and faster in operating speed than the volatile memory.

The present invention also provides a semiconductor disk device in which high-speed access to a directory for an executable program code existing on a main storage is possible.

In addition, the present invention provides a semiconductor disk device which can be miniaturized to a size on the same order as that of a 3.5-inch, 2.5-inch or 1.8-inch hard disk device.

A semiconductor storage device of the present invention comprises a non-volatile semiconductor memory which has a certain storage capacity, a volatile cache memory which temporarily stores data and has a smaller storage capacity than the non-volatile semiconductor memory, and a controller which controls the input/output of data between the non-volatile semiconductor memory, the volatile cache memory and an external information processing device and performs the in put/output of data between the semiconductor memory and the external information processing device in accordance with a fixed-length block format. In an information processing system having a semiconductor storage device, a magnetic disk device and an information processing device, data having a high frequency of access is placed in the semiconductor storage device and data having a low frequency of access is placed in the magnetic disk device.

In the semiconductor storage device according to the present invention, since the storage capacity of the volatile cache memory is smaller than that of the non-volatile semiconductor memory or the number of the former is smaller than that of the latter, the size of the whole of the device can be made effectively small.

In order to provide a compatibility with a 3.5-inch, 2.5-inch or 1.8-inch hard disk device with respect to an interface at the time of data transfer, there is employed a fixed-length block format (FBA format) which is a standard format common to those devices.

In the information processing system in which the magnetic disk device and the semiconductor storage device are connected to a computer system and data having a high frequency of access is placed in the small-size storage device or semiconductor storage device whereas data having a low frequency of access is placed in the magnetic disk device, an average speed of access of the whole system to the storage medium is improved since the semiconductor storage device has a high access speed as compared with the magnetic disk device.

For example, the temporary saving of a program code existing on a main storage to the non-volatile storage medium and the reading of the program code from the non-volatile storage medium can be performed at a high speed during successive execution of respective parts of a large scale program all of which cannot be accommodated in the main storage.

DETAILED DESCRIPTION

Embodiments of the present invention will be explained in detail by use of the accompanying drawings.

Figure 1A:
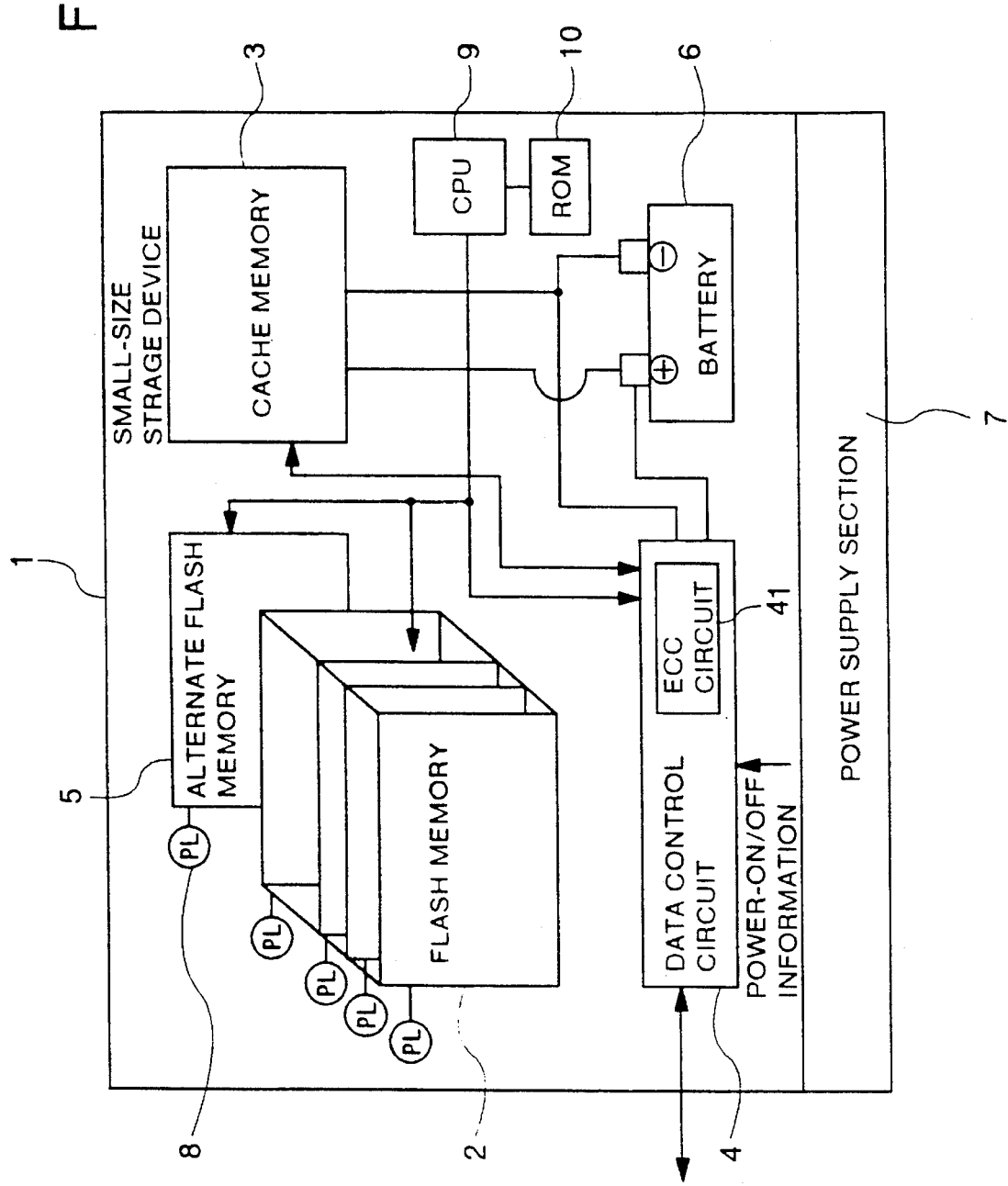
FIG. 1A is a functional block diagram of a small-size storage device according to the present invention.

FIG. 1A is a functional block diagram of a small-size storage device 1 which is a semiconductor storage device according to the present invention. The device 1 is composed of a main flash memory 2, a cache memory 3, a data control circuit 4, an alternate flash memory 5, a power supply section 7, a battery 6, a CPU 9 and a ROM 10. When a power supply is turned on, the power supply section 7 supplies an electric power to the respective parts of the small-size storage device 1 and at the same time charges the battery 6. In the present embodiment, each of the main flash memory 2 and the alternate flash memory 5 is formed by a batch erasion type of EFPROM (flash memory). However, the memory 2 or 5 may be any memory so long as it is an EEPROM (Electrically Erasable and Programmable ROM). The cache memory 3 is a volatile memory and is formed by a dynamic random access memory (DRAM) or a static random access memory (SRAM).

Figure 1B:
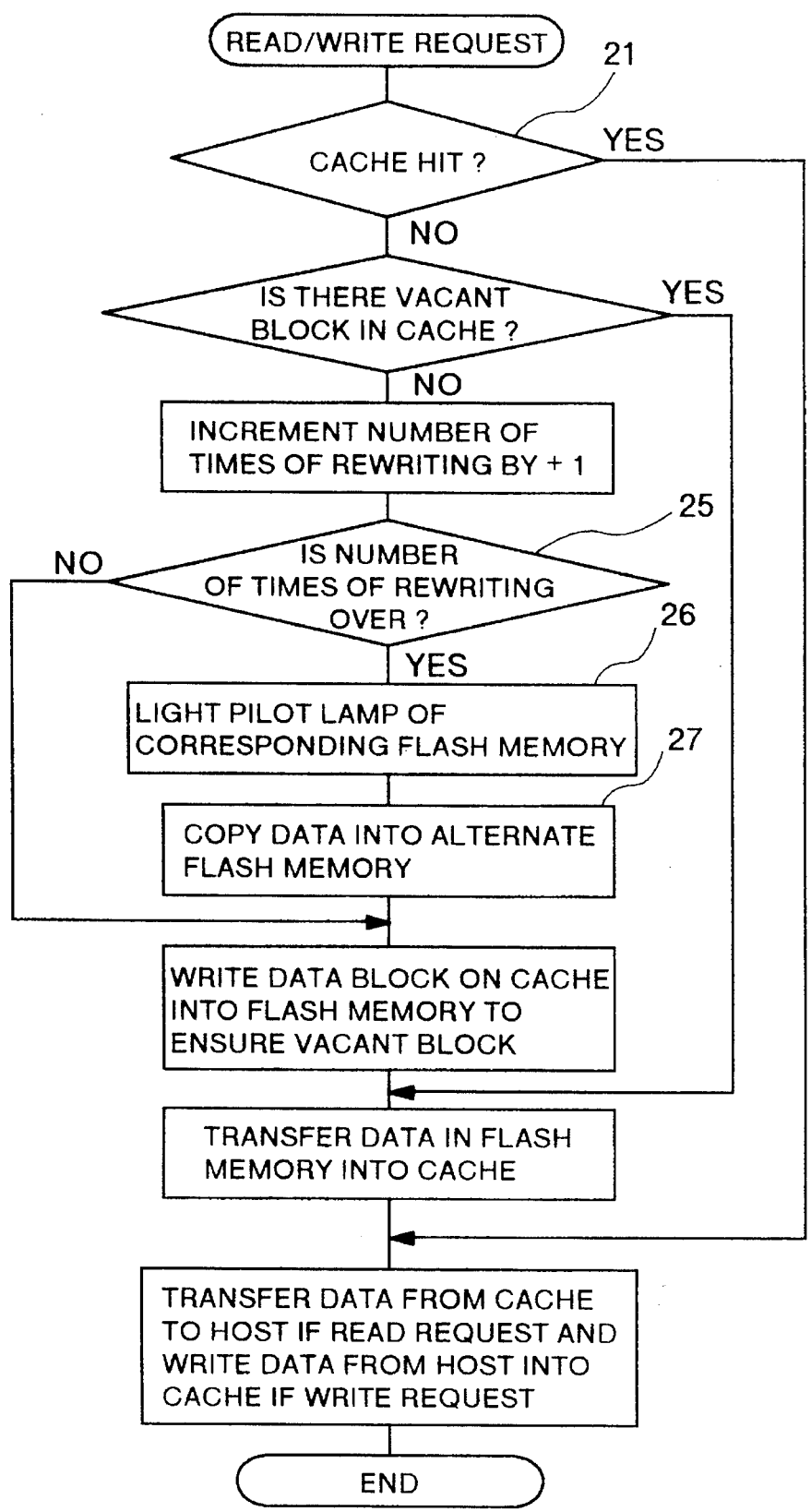
FIG. 1B is a flow chart of the lighting of a pilot lamp and a cache memory access associated with the rewriting for a flash memory.

The operation of the small-size storage device 1 of FIG. 1A, when a read/write request is issued, is shown in FIG. 1B. When a data read instruction is issued from a host device connected to the data control circuit 4, the data control circuit 4 reads data added with an error correction code (ECC) from a designated address of the main flash memory 2. In the case where one bit of the data includes an error, the data control circuit 4 can make the correction of data by use of the ECC. Thereafter, the data is written into the cache memory 3 for the subsequent re-access and transfer of that data to the host device or information processing device.

When a data write instruction is issued from the host device, data added with ECC is written into the cache memory 3 through the data control circuit 4, thereby completing the operation of writing of data into the small-size storage device when seen from the host device. After the high-speed writing of data into the cache memory, the host device can be used for another operation. The data written in the cache memory 3 remains stored in the cache memory 3 as long as possible. When the CPU 9 detects the possibility of overflow of the cache memory 3 or the data control circuit 4 detects the stoppage of a power supply in accordance with a power-on/off information signal from the power supply section 7, data of the cache memory 3 is written into an area of the main flash memory 2 at the corresponding address, thereby implementing the non-volatilization of data.

In the case where an instruction for access to data existing on the cache memory 3 is issued from the host device, a hit on the corresponding data on the cache memory 3 is made (step 21 in FIG. 1B) and hence a read/write processing for that data is performed. Data the writing of which is completed remains placed in the cache memory 3 so long as an area of the cache memory 3 having that data stored is not subjected to the writing of new data. The reading of data from the main flash memory 2 is made only in the case where a new read request is generated from the host device and the corresponding area of the cache memory 3 has been used so that the corresponding data is erased from the cache memory 3.

By thus suppressing the number of times of main flash memory access, especially, write access to the minimum, it is possible to elongate the lifetime of the flash memory.

In the case where the capacity of the cache memory is small, the cache hit rate is lowered and the number of times of flash memory access is increased. A direct measure to counter such a case may include a method of increasing the capacity of the cache memory. However, the above-mentioned method of suppressing the write access to the flash memory to the minimum can be employed as an indirect countermeasure.

When the error of two or more bits in data of a certain block read from the main flash memory 2 is detected (by an ECC circuit 41 in the data control circuit 4) or when the number of times of rewriting for a certain block in the main flash memory 2 reaches a limited value, for example, 100,000 (step 25 in FIG. 1B), the alternate flash memory 5 serves as a substitute for that block or data of that block is stored into the alternate flash memory (step 27), thereby maintaining the reliability of data. A pilot lamp PL is lighted for a flash memory including the block for which the bit error has been detected or the block for which the limited value has been reached (step 26). Thereafter, a memory access to data of the block in the main flash memory 2 substituted by the alternate flash memory 5 is executed in a form changed by a microprogram of the data control circuit 4 to a memory access to the alternate flash memory 5. A service person of the device finds out and exchanges a flash memory having a lighted pilot lamp at the time of periodic check and information of the use as a new alternate memory is registered into the data control circuit 4.

The battery 6 supplies an electric power in a period of time when the data control circuit 4 writes data of the cache memory 3 into the main flash memory 2 by use of an instruction from the CPU 9 at the time of power stoppage or in the case where the power supply section 7 is placed into a power-off condition by an instruction for turning the device off. Thereby, the data is prevented from being lost.

When an instruction concerning an interface is inputted to the device 1 as a command of SCSI (Small Computer System Interface), PC/AT (ISA, EISA (Extended Industry Standard Architecture)) or PCMCIA (Personal Computer Memory Card International Association, the CPU (Central Processing Unit) 9 realizes that instruction by reading and executing a program which is stored in the ROM 10 and corresponds to the command.

The SCSI is a standard interface between a computer body and a peripheral device. The PC/AT (ISA, EISA) is an interface designed as an open architecture and is a bus interface used in a computer having a compatibility with PC/AT of IBM corporation. The PCMCIA is an international standard interface for memory card used in a personal computer or the like.

Regarding each interface, the procedure of an interface handshake is stored in the ROM 10. The CPU 9 reads the procedure from the ROM 10. In the case where the reading or writing of data from or into the flash memory 2 or 5 is designated, the CPU 9 activates the data control circuit 4 to effect data transfer by the data control circuit 4.

A change-over of each interface procedure is realized by replacing a ROM including a program corresponding to a command. In other words, the change-over of each interface procedure is realized by the replacement of a ROM in which the procedure is stored. Namely, in the device of the present embodiment, when a hardware reset is made after the replacement of a ROM and the exchange of a connector for connecting an external device and the control circuit 4, the CPU 9 performs a start processing on the basis of information stored in a ROM 10, thereby effecting an interface procedure stored in that ROM 10.

Figure 2A:
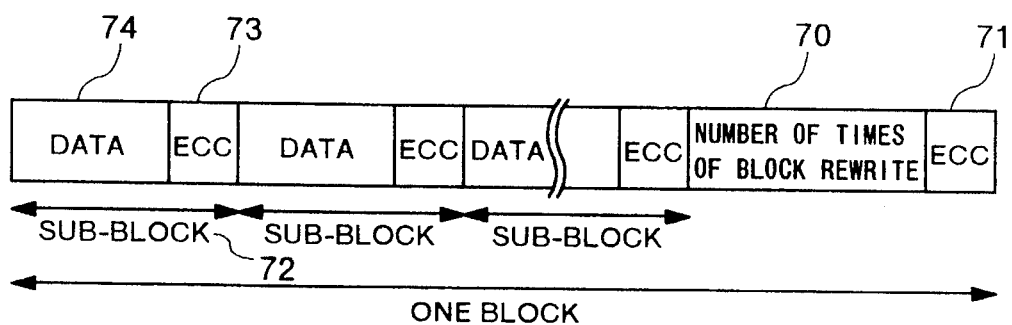
FIGS. 2A and 2B are diagrams for explaining a data format of the flash memory.

FIG. 2A shows a data format of a block in the flash memory 2 or 5. In FIG. 2A, ECC 73 is an ECC for data 74 in each of a plurality of sub-blocks 72 which form one block. One block shown in FIG. 2A corresponds to one logical block of a small-size magnetic disk device. An ECC may be provided for data of the whole of one block. Also, an ECC 71 is provided which is to be added for only data of the number 70 of times of block rewrite used for change-over to a preliminarily prepared alternate flash memory when a predetermined number of times of rewriting is reached.

Figure 2B:
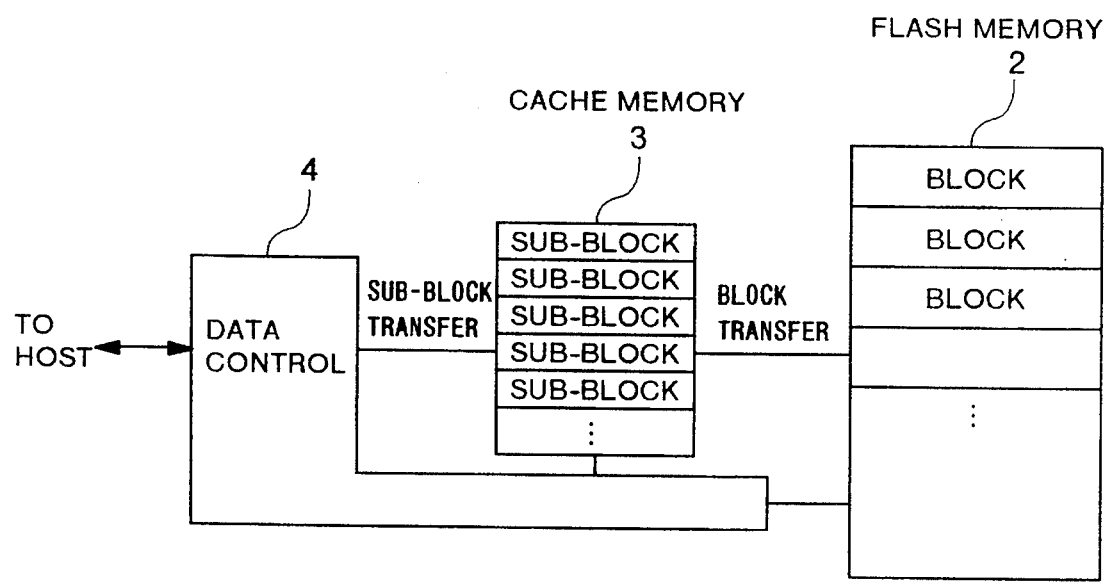

The one block has the same data structure as that of one block when a small-size magnetic disk device makes data exchange for a host device or host computer. The external specification seen from the exterior of the storage device is fully compatible with a magnetic disk device of FBA (Fixed Block Architecture) in the level of command. Namely, as shown in FIG. 2B, the whole of a storage space of the flash memory 2 is divided into a plurality of fixed-length blocks. All the blocks are allotted with block numbers. Data access from the host device is made in units of one block. Emulation becomes possible by corresponding one block of the FBA to a block which is a control unit of the flash memory 2 or 5.

In the fixed-length block format, a request for access to the device 1 is made by use of a logical block number. The device 1 makes a control after translation of the logical number into a block number and a sub-block number. An expression for translation is as follows:

> block number = quotient of [(logical block number) ÷ (number of sub-blocks per block)]
> and
> sub-block number = [(logical block number) − (block number) × (number of sub-blocks per block)]

where the block number corresponds to a writing unit of the flash memory and the sub-block number corresponds to a logical block of a magnetic disk device.

The FBA emulation is realized in such a manner that a data storage format is beforehand stored in the ROM 10 for each interface and the CPU 9 designates data transfer adapted for the storage format when data transfer is to be made between the flash memory 2 or 5 and and the host information processing device.

Each board of the main and alternate flash memories 2 and 5 is provided with a pilot lamp (PL) 8, thereby improving the maintenability in such a manner that the pilot lamp is extinguished when the memory is in a normal operation and is lighted in the case where a failure is generated in the memory.

Figure 3:
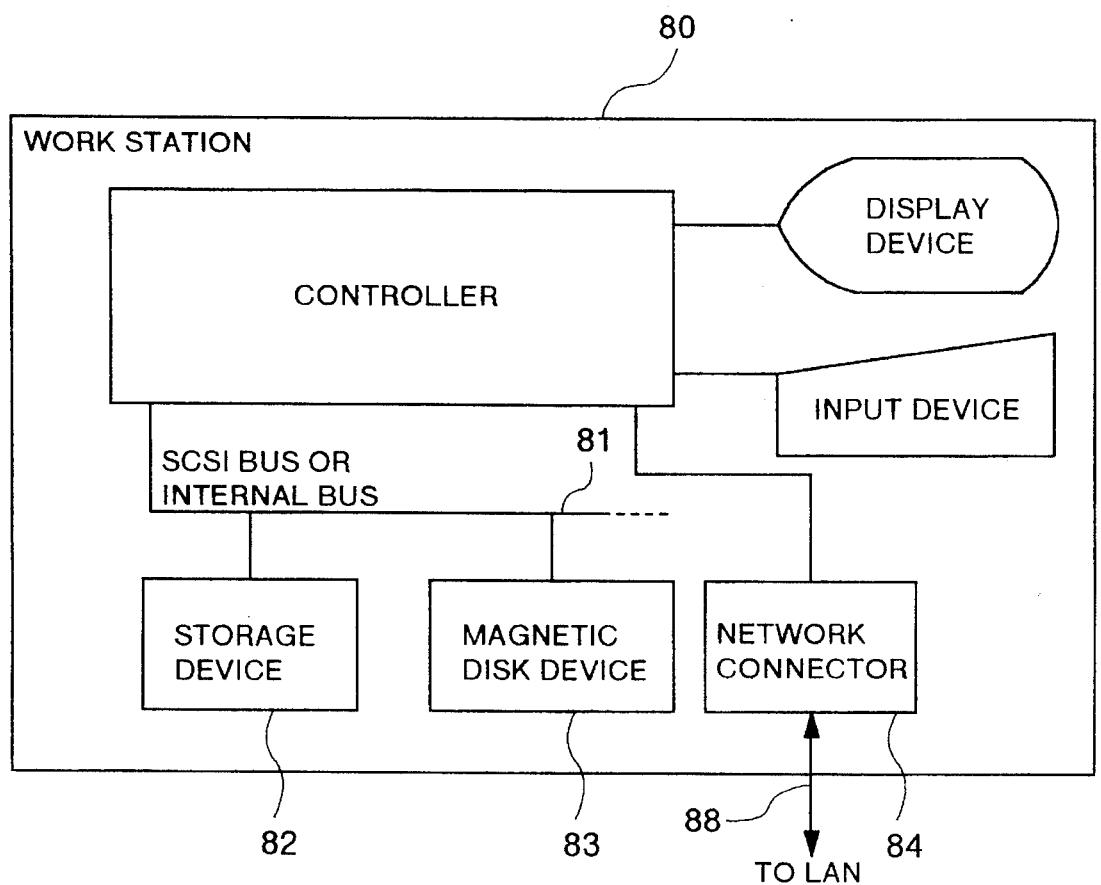
FIG. 3 is a block diagram of a small-size work station provided with a fixed-length semiconductor storage device according to the present invention.

FIG. 3 shows an embodiment in which a storage device 82 according to the present invention is incorporated in a work station. Since the storage device has the same size as a 2.5-inch or 1.8-inch magnetic disk device and either of SCSI, PC/AT bus interface and PCMCIA interface serving as a standard of a host interface is supported by data in a ROM, it is possible to substitute the storage device for the conventional small-size magnetic disk device.

Though there is no clear standard for the size of the 1.8-inch or 2.5-inch magnetic disk device, typical dimensions are such that the 1.8-inch magnetic disk device has a width of 54.0 mm, a depth of 85.5 mm and a height of 10.5 or 12.5 mm and the 2.5-inch magnetic disk device has a width of 73.0 mm, a depth of 101.6 mm and a height of 12.5 mm.

In the present embodiment, the conventional small-size magnetic disk device 83 and the small-size storage device 82 are connected in parallel to each other. In the case where a service such as a data base or the like is made, a program code and directory information of the data base (such as index and directory) having a high frequency of access is stored in the small-size storage device having a high access speed. Thereby, an average access time can be shortened and a system attaining a high speed as the whole of the system can be constructed.

Taking a data base with a plurality of files A, B, C, —by way of example, the distribution of data is such that when a directory portion having a high frequency of use is the file A and portions storing a data body as the result of search are the files B and C, the file A having a high frequency of access is placed in the small-size storage device and the file B having a low frequency of access is placed in the conventional magnetic disk device.

Since the small-size storage device in the present embodiment has no rotating and seek mechanical parts, data access to the small-size storage device can be made at a high speed as compared with the magnetic disk device but a storage capacity per unit volume of the small-size storage device is small. On the other hand, in a general data base, the capacity of directory information necessary for searching user data is smaller than that of user data but the directory information is accessed at a high frequency as compared with the user data. For such circumstances, with the construction in which directory information for making access to the magnetic disk is placed in the small-size storage device, it is possible to realize the speed-up of a data base system.

Next, reference will be made to a relationship in capacity between flash and cache memories in the small-size storage device. The locality of access exists even for the directory information and the capacity of data actually accessed at a high frequency is considerably smaller than the overall capacity of directory. Therefore, the capacity of the cache memory in the small-size storage device can be made smaller than that of the flash memory, thereby making it possible to effectively form the whole of a storage system.

By connecting the fixed-length small-size magnetic disk device and the fixed-length small-size storage device to a network such as LAN 88 through a network connector 84, it becomes possible to use these devices as network servers.

As another storage system for attaining a further speed-up, there may be employed a construction in which only small-size storage devices are provided and no magnetic disk device is provided. Also, if the main flash memory 2 has an excessive space other than a space for storage of all directories, data may be stored in the main flash memory.

A magnetic disk device including many physical or mechanical parts has a very poor shock resistance and has a possibility that data may be lost according to handling. To the contrary, a semiconductor storage device formed by semiconductor parts has an excellent shock resistance and is therefore very effective for a personal computer which is frequently moved.

The present embodiment as mentioned above can provide a small-size magnetic disk device which contributes to the speed-up of a service in a small-size work station or the like and the facilitation of handling of a small-size personal computer.

According to a preferred embodiment of the present invention, a battery is provided for supplying an electric power with which data stored in the volatile cache memory is stored into the non-volatile semiconductor memory at the time of power-off. Also, in the case where a failure is generated in the non-volatile semiconductor memory, there is provided an electrically rewritable or erasable alternate non-volatile semiconductor memory which, in the case where a failure is generated in a non-volatile semiconductor memory, stores data as a substitute for the faulty memory.

According to the present invention, there can be provided a semiconductor storage device which can be miniaturized to a size on the same order as that of a 3.5-inch, 2.5-inch or 1.8-inch hard disk device.

Also, it becomes possible to attain an access speed of several hundred μs which is about 100 times as high as the access speed of the conventional small-size disk device (several ten ms).

Further, when the two devices are used in combination, a large-capacity and high-speed system can be constructed.

With the use of the non-volatile semiconductor memory, the shock resistance is improved. By incorporating the non-volatile semiconductor memory in a personal computer, it is possible to realize a personal computer which is easy to handle.

What is claimed is:

1. A semiconductor storage device connected to at least one magnetic storage device, the input and output of data being made between the semiconductor storage device and an information processing device, the semiconductor storage device comprising:

a non-volatile semiconductor memory in which data is electrically rewritable and which stores directory information of data stored in said at least one magnetic storage device;

a volatile semiconductor memory which has a storage capacity smaller than that of said non-volatile semiconductor memory and the storage contents of which are updated to store a part of said directory information having a higher frequency of access from said information processing device;

a CPU connected to said volatile semiconductor memory and said non-volatile semiconductor memory for making access to said volatile semiconductor memory and said non-volatile semiconductor memory in accordance with an access request from said information processing device; and wherein when access to said volatile semiconductor memory made for access from said information processing device to said at least one magnetic storage device hits on said part of said directory information, said CPU transfers said part of said directory information to said information processing device without making access to said non-volatile semiconductor memory and said information processing device makes access to said at least one magnetic storage device on the basis of said part of said directory information.

2. A semiconductor storage device according to claim 1, further comprising:

at least one alternate memory board having a storage capacity smaller than that of said non-volatile semiconductor memory;

a data control circuit connected to said CPU, said non-volatile semiconductor memory, said volatile semiconductor memory and said alternate memory board for making data communication with said information processing device in accordance with an instruction from said CPU; and wherein in accordance with an instruction from a ROM connected to said CPU and storing a program for access control for said non-volatile semiconductor memory and said volatile semiconductor memory corresponding to an access request from said information processing device and when the number of times of writing into one board of said non-volatile semiconductor memory reaches a predetermined number of times, said CPU causes said data control circuit to make a change in control so that data of said one board is transferred to said at least one alternate memory board and subsequent access is made to said alternate memory board.

3. A semiconductor storage device according to claim 2, wherein each of said at least one alternate memory board and the board of said non-volatile semiconductor memory is provided with a pilot lamp, and said CPU lights the pilot lamp of said one board for which said predetermined number of times is reached.

4. A semiconductor storage device according to claim 2, wherein said data control circuit translates a logical block number included in the access request received from said information processing device into a block number and a sub-block number in accordance with a predetermined operation so that the transfer of data between said data control circuit and a cache memory is made in a fixed-length form.

5. A semiconductor storage device according to claim 4, wherein said data control circuit makes the transfer of data between said data control circuit and a flash memory in a fixed-length form on the basis of said block number the unit of which is composed of a plurality of sub-blocks.

6. A semiconductor storage device according to claim 4, wherein said ROM stores interface data for data accessed between said information processing device and said data control circuit, and said data control circuit makes the transfer of data for said information processing device on the basis of said interface data.

7. A semiconductor storage device according to claim 6, wherein said ROM stores interface data of either of SCSI, PC/AT and PCMCIA.

8. A semiconductor storage device according to claim 1, further comprising:

at least one alternate memory board having a storage capacity smaller than that of said non-volatile semiconductor memory;

a data control circuit connected to said CPU, said non-volatile semiconductor memory, said volatile semiconductor memory and said alternate memory board for making data communication with said information processing device in accordance with an instruction from said CPU, said data control circuit including an ECC circuit for checking an ECC added to data to judge whether or not the data includes an error; and wherein in accordance with an instruction from a ROM connected to said CPU and storing a program for access control for said non-volatile semiconductor memory and said volatile semiconductor memory corresponding to an access request from said information processing device and when said ECC circuit determines that data written in one board of said non-volatile semiconductor memory includes an error, said CPU causes said data control circuit to make a change in control so that data of said one board is transferred to said at least one alternate memory board and subsequent access is made to said alternate memory board.

9. A semiconductor storage device according to claim 8, wherein each of said at least one alternate memory board and the board of said non-volatile semiconductor memory is provided with a pilot lamp, and said CPU lights the pilot lamp of said one board which has the erroneous data.

10. A semiconductor storage device according to claim 8, wherein said data control circuit translates a logical block number included in the access request received from said information processing device into a block number and a sub-block number in accordance with a predetermined operation so that the transfer of data between said data control circuit and a cache memory is made in a fixed-length form.

11. A semiconductor storage device according to claim 10, wherein said data control circuit makes the transfer of data between said data control circuit and a flash memory in a fixed-length form on the basis of said block number the unit of which is composed of a plurality of sub-blocks.

12. A semiconductor storage device according to claim 10, wherein said ROM stores interface data for data accessed between said information processing device and said data control circuit, and said data control circuit makes the transfer of data for said information processing device on the basis of said interface data.

13. A semiconductor storage device according to claim 12, wherein said ROM stores interface data of either of SCSI, PC/AT and PCMCIA.

14. A storage system comprising:

a processor;

a main storage connected to said processor, said main storage storing data;

at least one magnetic disk device connected to said processor, said at least one magnetic disk device storing data;

a semiconductor storage device connected to said processor, said semiconductor storage device comprising:

a non-volatile semiconductor memory in which data is electrically rewritable and storing data which is stored in said at least one magnetic storage device;

a cache memory connected to said non-volatile semiconductor memory, said cache memory storing that part of the data stored in said non-volatile semiconductor memory which has a higher frequency of access; and a CPU connected to said cache memory and non-volatile semiconductor memory for making access to said cache memory and non-volatile semiconductor memory in accordance with an access request from said processor, and wherein said CPU makes access to said non-volatile semiconductor memory and said cache memory when the access from said CPU to said cache memory makes no hit.

15. A storage system according to claim 14, said semiconductor storage device further comprising a data control circuit for translating a logical block number included in an access request received from said processor into a block number and a sub-block number in accordance with a predetermined operation so that the transfer of data between said data control circuit and said non-volatile semiconductor memory is made in a fixed-length form.

* * * * *

UNITED STATES PATENT AND TRADEMARK OFFICE
CERTIFICATE OF CORRECTION

PATENT NO. : 5,546,348
DATED : 13 August 1996
INVENTOR(S) : Hisao HONMA et al.

It is certified that error appears in the above-indentified patent and that said Letters Patent is hereby corrected as shown below:

| Column | Line | |
|---|---|---|
| 1 | 63 | Change "in put" to --input--. |
| 2 | 32 | Change "large scale" to --large-scale--. |
| 3 | 43 | After "especially" delete ","; after "write access" insert --,--. |
| 4 | 54 | After "number" delete "70"; after "rewrite" insert --70--. |
| 6 | 54 | Change "is" to --corresponds to--. |

Signed and Sealed this

Seventeenth Day of December, 1996

Attest:

BRUCE LEHMAN

*Attesting Officer*     *Commissioner of Patents and Trademarks*